US009167727B2

(12) United States Patent
Mao

(10) Patent No.: US 9,167,727 B2
(45) Date of Patent: Oct. 20, 2015

(54) RAPIDLY ASSEMBLING/DISASSEMBLING DEVICE AND ELECTRONIC EQUIPMENT

(71) Applicant: WISTRON CORP., New Taipei (TW)

(72) Inventor: Zhong-Hui Mao, New Taipei (TW)

(73) Assignee: WISTRON CORP., New Taipei (TW)

( * ) Notice: Subject to any disclaimer, the term of this patent is extended or adjusted under 35 U.S.C. 154(b) by 162 days.

(21) Appl. No.: 14/094,757

(22) Filed: Dec. 2, 2013

(65) Prior Publication Data
US 2015/0070843 A1 Mar. 12, 2015

(30) Foreign Application Priority Data
Sep. 6, 2013 (CN) .......................... 2013 1 0404428

(51) Int. Cl.
*H05K 7/20* (2006.01)
*F04D 29/60* (2006.01)

(52) U.S. Cl.
CPC .......... *H05K 7/20727* (2013.01); *F04D 29/601* (2013.01); *H05K 7/20172* (2013.01); *H05K 7/20136* (2013.01)

(58) Field of Classification Search
CPC ............ F04D 29/601; H05K 7/20136; H05K 7/20172; H05K 7/20554–7/20581; H05K 7/20718–7/20736
See application file for complete search history.

(56) References Cited

U.S. PATENT DOCUMENTS

| 7,445,430 | B2 * | 11/2008 | Kao ........................ G06F 1/181 415/121.2 |
| 7,699,582 | B2 * | 4/2010 | Tao ..................... H05K 7/20172 415/213.1 |
| 7,771,165 | B2 * | 8/2010 | Chen ..................... F04D 29/601 174/252 |
| 8,246,301 | B2 * | 8/2012 | Li ............................. G06F 1/20 415/213.1 |
| 8,939,722 | B2 * | 1/2015 | Liu ..................... H05K 7/20172 415/213.1 |
| 2005/0106003 | A1 * | 5/2005 | Fang ..................... F04D 29/601 415/60 |
| 2011/0158791 | A1 * | 6/2011 | Li ...................... H05K 7/20727 415/119 |
| 2013/0026332 | A1 | 1/2013 | Liu |

* cited by examiner

Primary Examiner — Robert J Hoffberg
(74) Attorney, Agent, or Firm — CKC & Partners Co., Ltd.

(57) ABSTRACT

The disclosure discloses a rapidly assembling/disassembling device including a fixing frame, partitions, pushing brackets, and a fastening member. The fixing frame includes a first side plate and a second side plate. Fan modules are sequentially arranged between the first and second side plates. The second side plate abuts against a second side of the adjacent fan module. Each of the partitions abuts against the second side of the corresponding fan module. Each of the pushing brackets is pivotally connected in the fixing frame. Each of the pushing brackets includes a pushing arm. The fastening member is disposed on the first side plate. When the fastening member pushes the adjacent pushing bracket to abut against a first side of the adjacent fan module, each of the other pushing brackets is pushed by the corresponding pushing arm to abut against the first side of the corresponding fan module.

20 Claims, 9 Drawing Sheets

RAPIDLY ASSEMBLING/DISASSEMBLING DEVICE AND ELECTRONIC EQUIPMENT

RELATED APPLICATIONS

This application claims priority to Chinese Application Serial Number 201310404428.8, filed Sep. 6, 2013, which is herein incorporated by reference.

BACKGROUND

1. Technical Field

The present disclosure relates to a rapidly assembling/disassembling device and an electronic equipment. More particularly, the present disclosure relates to a rapidly assembling/disassembling device that is capable of rapidly assembling/disassembling a fan module in an electronic equipment.

2. Description of Related Art

Whether a rack server or a storage equipment (e.g., a cloud network equipment) stably performs largely depends on the cooling capability. Currently, using a fan module to dissipate heat is the most commonly and effective way of cooling. Hence, a plurality of fan modules are often arranged and installed in a rack server or a storage equipment.

However, the fan modules are easy to be torn and worn in the rack server or the storage equipment, and thus need to be frequently maintained or replaced. The rack server or the storage equipment generally operates 24 hours without stopping, so that the procedures of maintaining or replacing the fan modules must be simple and convenient. If the fan modules can be maintained or replaced with the simple and convenient procedures, not only the time of maintaining or replacing the fan modules can be reduced, but the influences to the rack server or the storage equipment caused during the maintenance or replacement can be minimized.

Accordingly, how to rapidly assemble/disassemble the fan modules in the rack server or the storage equipment to solve the foregoing problem becomes an important issue to be solved.

SUMMARY

The disclosure provides a rapidly assembling/disassembling device for assembling or disassembling a plurality of fan modules. The rapidly assembling/disassembling device includes a fixing frame, a plurality of partitions, a plurality of pushing brackets, and a fastening member. The fixing frame includes a first side plate and a second side plate. The fan modules are accommodated in the fixing frame and sequentially arranged between the first side plate and the second side plate. The first side plate is located at a first side of the adjacent fan module. The second side plate abuts against a second side of the adjacent fan module. The partitions are fixed in the fixing frame. Each of the partitions abuts against the second side of the corresponding fan module. The pushing brackets are pivotally connected in the fixing frame. Each of the pushing brackets is located at the first side of the corresponding fan module and includes a pushing arm. The pushing arm extends toward the second side plate. The fastening member is disposed on the first side plate and capable of moving toward or away from the adjacent pushing bracket. When the fastening member pushes the adjacent pushing bracket to rotate to abut against the first side of the adjacent fan module, each of the other pushing brackets is pushed by the corresponding pushing arm so as to abut against the first side of the corresponding fan module.

In an embodiment of the disclosure, the second side plate has a first breach. The first breach is configured for the pushing arm of the adjacent pushing bracket to pass through. Each of the partitions has a second breach. The second breach is configured for the pushing arm of the corresponding pushing bracket to pass through.

In an embodiment of the disclosure, the second side plate includes a first resilient arm. The first resilient arm abuts against the second side of the corresponding fan module.

In an embodiment of the disclosure, each of the partitions includes a second resilient arm. The second resilient arm abuts against the second side of the corresponding fan module.

In an embodiment of the disclosure, each of the pushing brackets further includes a protruding portion. The protruding portion protrudes toward the first side of the corresponding fan module.

In an embodiment of the disclosure, the first side plate has a through hole. The fastening member includes a stud and a thumb screw. The stud is disposed on the first side plate and has a screw hole. The screw hole is communicated with the through hole. The thumb screw is fastened to the screw hole and capable of moving toward or away from the adjacent pushing bracket.

In an embodiment of the disclosure, the thumb screw includes a twisting portion and a threaded portion. The twisting portion is located out of the fixing frame. The threaded portion is connected to the twisting portion, fastened to the screw hole, and capable of entering the fixing frame via the through hole.

In an embodiment of the disclosure, the fixing frame further includes a first bracket and a second bracket. The first bracket and the second bracket are respectively connected to two sides of the first side plate and the second side plate. Each of the fan modules is individually located between the first bracket and the second bracket.

In an embodiment of the disclosure, the first bracket has a plurality of first fixing holes. The second bracket has a plurality of second fixing holes. Two sides of each of the partitions respectively have a first extending arm and a second extending arm. The first extending arm is engaged with the corresponding first fixing hole. The second extending arm is engaged with the corresponding second fixing hole.

In an embodiment of the disclosure, the first bracket has a plurality of first pivoting holes. The second bracket has a plurality of second pivoting holes. Two sides of each of the pushing brackets respectively have a first shaft and a second shaft. The axis of the first shaft coincides with the axis of the second shaft. The first shaft is pivotally connected to the corresponding first pivoting hole. The second shaft is pivotally connected to the corresponding second pivoting hole.

The disclosure further provides an electronic equipment. The electronic equipment includes a housing, a plurality of fan modules, and a rapidly assembling/disassembling device. The housing includes a base plate. The rapidly assembling/disassembling device includes a fixing frame, a plurality of partitions, a plurality of pushing brackets, and a fastening member. The fixing frame is disposed on the base plate and includes a first side plate and a second side plate. The fan modules are supported on the base plate, accommodated in the fixing frame, and sequentially arranged between the first side plate and the second side plate. The first side plate is located at a first side of the adjacent fan module. The second side plate abuts against a second side of the adjacent fan module. The partitions are fixed in the fixing frame. Each of the partitions abuts against the second side of the corresponding fan module. The pushing brackets are pivotally connected in the fixing frame. Each of the pushing brackets is located at the first side of the corresponding fan module and includes a pushing arm. The pushing arm extends toward the second side plate. The fastening member is disposed on the first side plate and capable of moving toward or away from the adjacent pushing bracket. When the fastening member pushes the adjacent pushing bracket to rotate to abut against the first side of the adjacent fan module, each of the other pushing brackets is pushed by the corresponding pushing arm so as to abut against the first side of the corresponding fan module.

Accordingly, the rapidly assembling/disassembling device fixes the fixing frame onto the base plate of the electronic equipment to accommodate the fan modules. The pushing brackets that are pivotally connected in the fixing frame are further respectively located at the first sides of the fan modules, and the second side plate of the fixing frame and the partitions that are fixed in the fixing frame respectively abut against the second sides of the fan modules. During the period that a user tightens the thumb screw disposed at the first side plate of the fixing frame, the thumb screw pushes the adjacent pushing bracket to rotate, and the rotated pushing bracket sequentially pushes the next pushing bracket. Based on the same principle, all of the pushing brackets will rotate together and respectively abut against the first sides of the fan modules, so as to fasten all of the fan modules at the same time. In contrast, when the user loosens the thumb screw, all of the fan modules can be released at the same time.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
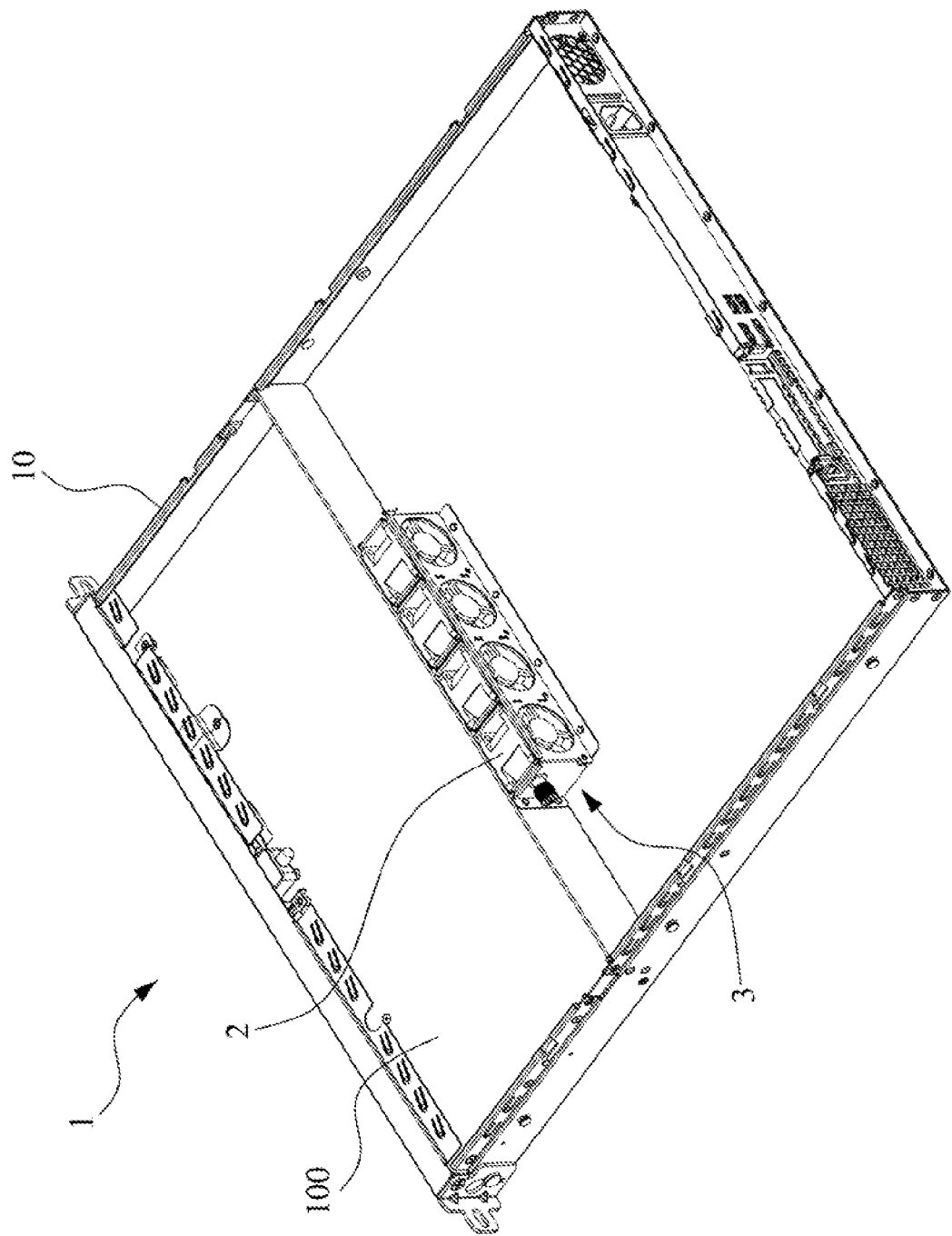
FIG. 1 is a perspective view of an electronic equipment according to an embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2A:
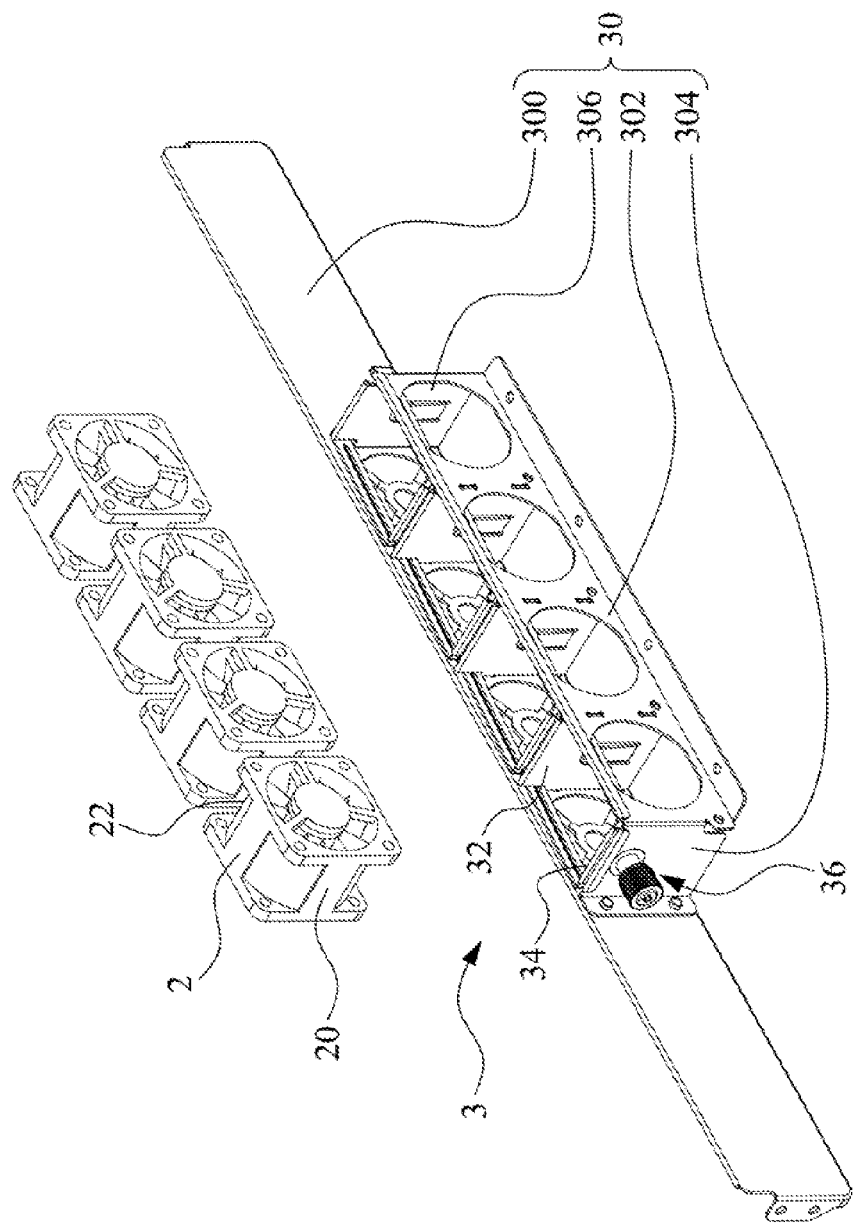
FIG. 2A is a perspective view of fan modules and a rapidly assembling/disassembling device in FIG. 1.

FIG. 1 is a perspective view of an electronic equipment 1 according to an embodiment of this disclosure. FIG. 2A is a perspective view of fan modules 2 and a rapidly assembling/disassembling device 3 in FIG. 1.

As shown in FIG. 1 and FIG. 2A, the electronic equipment 1 includes a housing 10, a plurality of fan modules 2, and a rapidly assembling/disassembling device 3. The housing 10 includes a base plate 100. The fan modules 2 are supported on the base plate 100, and can be rapidly assembled or disassembled in the rapidly assembling/disassembling device 3. The fan modules 2 can dissipate the heat generated by heat sources (not shown) in the electronic equipment 1 by convection, or blow cold air toward the heat source for cooling, so as to maintain the performance of the electronic equipment 1 to be stable. In practice, the electronic equipment 1 can be a rack server or a storage equipment (e.g., a cloud network equipment), but the disclosure is not limited in this regard.

Figure 2B:
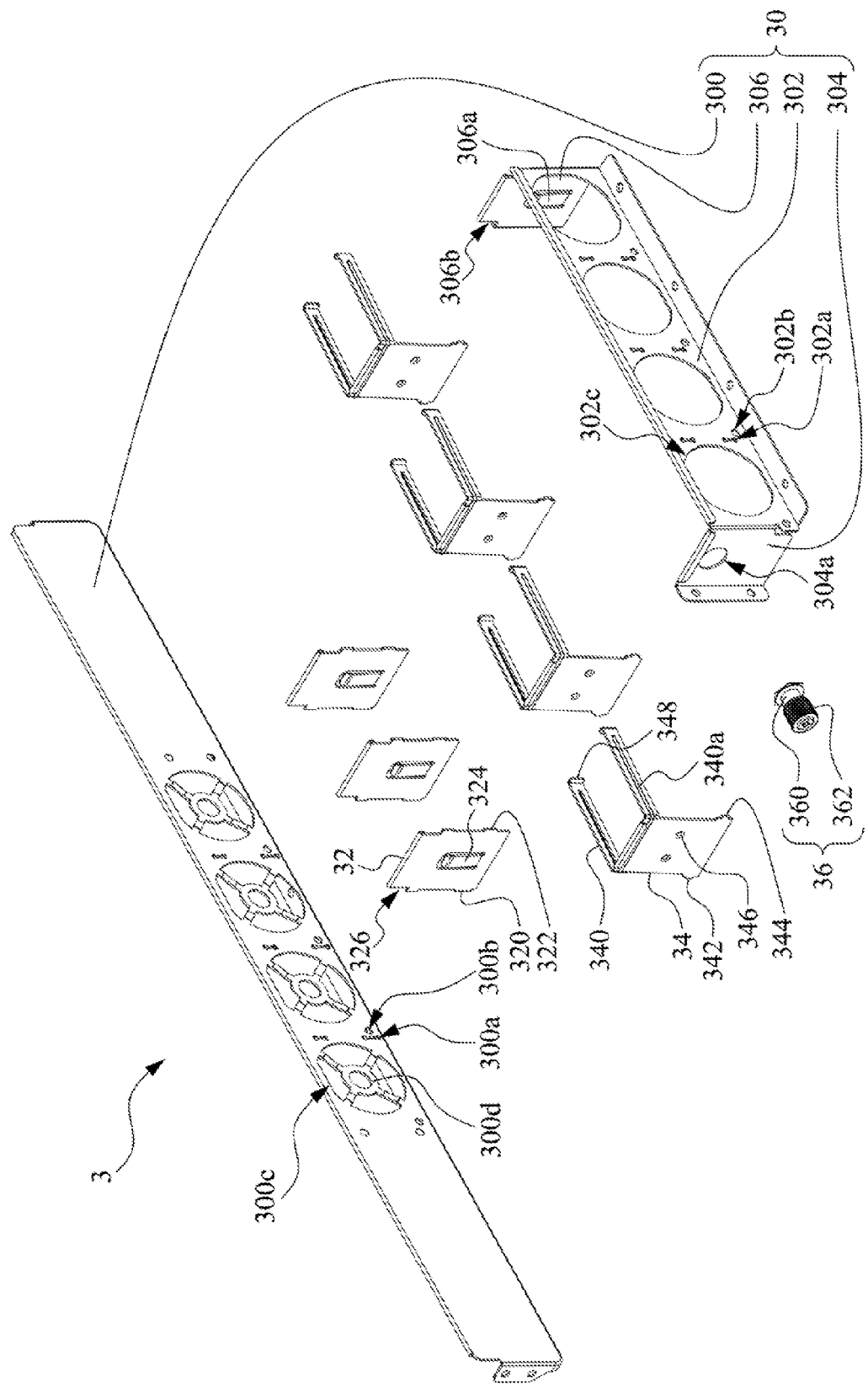
FIG. 2B is an exploded view of the rapidly assembling/disassembling device in FIG. 2A.
Figure 3:
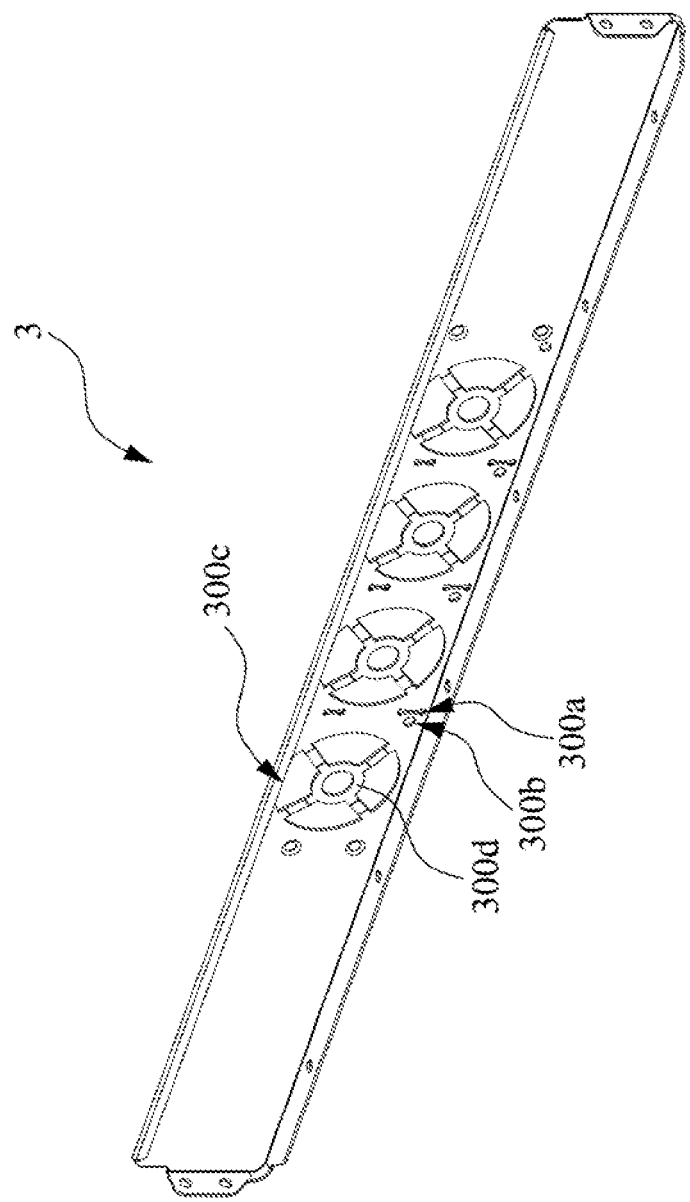
FIG. 3 is an exploded view of a first bracket in FIG. 2B.
Figure 4:
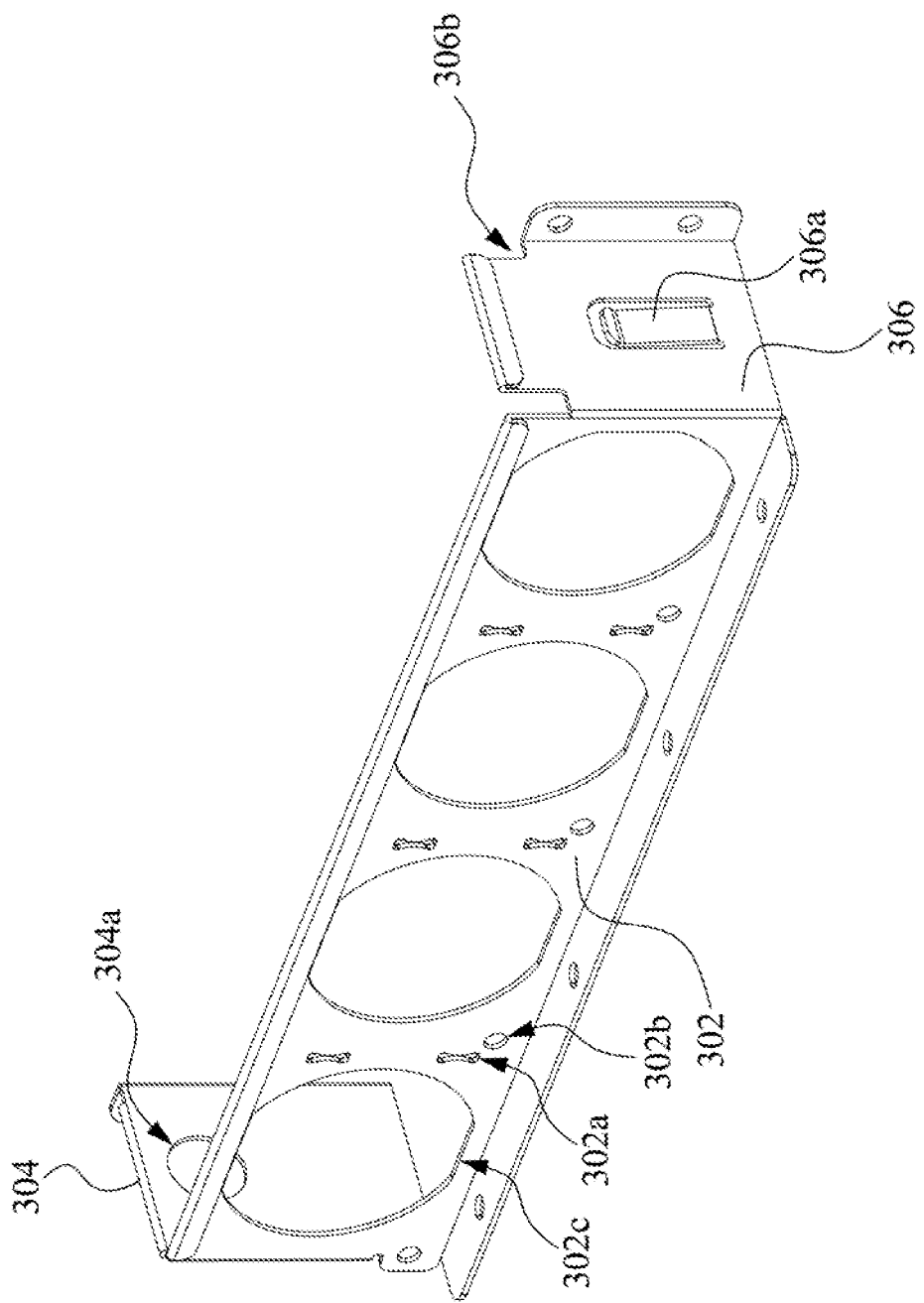
FIG. 4 is an exploded view of a second bracket, a first side plate, and a second side plate in FIG. 2B.
Figure 6:
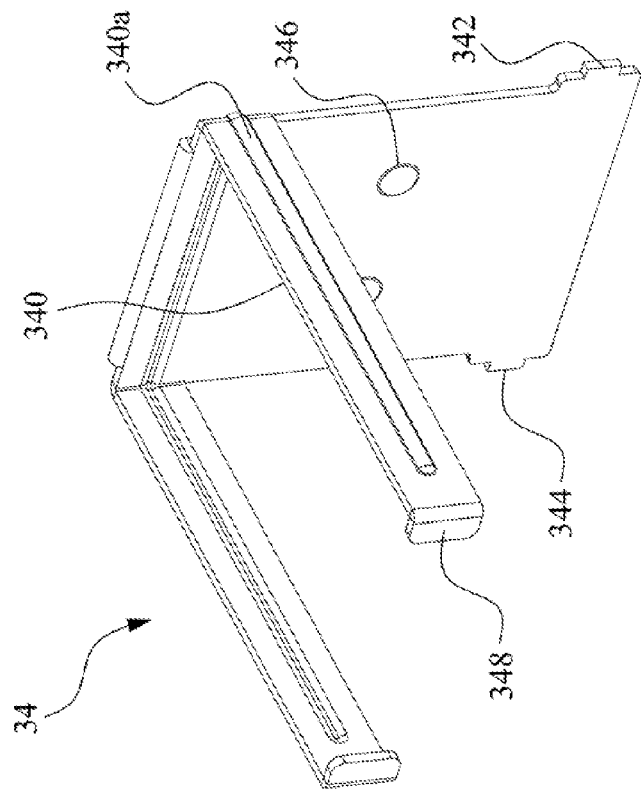
FIG. 6 is a perspective view of a pushing bracket in FIG. 2B.
Figure 5:
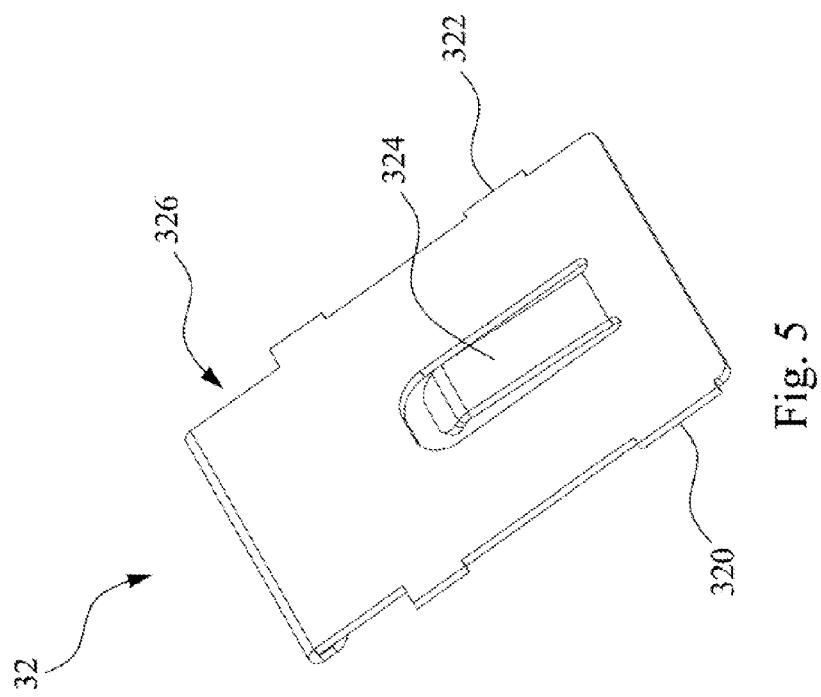
FIG. 5 is a perspective view of a partition in FIG. 2B.

FIG. 2B is an exploded view of the rapidly assembling/disassembling device 3 in FIG. 2A. FIG. 3 is an exploded view of a first bracket 300 in FIG. 2B. FIG. 4 is an exploded view of a second bracket 302, a first side plate 304, and a second side plate 306 in FIG. 2B. FIG. 5 is a perspective view of a partition 32 in FIG. 2B. FIG. 6 is a perspective view of a pushing bracket 34 in FIG. 2B.

As shown in FIG. 2B to FIG. 4, the rapidly assembling/disassembling device 3 includes a fixing frame 30. The fixing frame 30 includes the first bracket 300, the second bracket 302, the first side plate 304, and the second side plate 306. When the fixing frame 30 is fixed on the base plate 100, the first bracket 300 and the second bracket 302 are respectively connected to two sides of the first side plate 304 and the second side plate 306. In other words, the first bracket 300, the first side plate 304, the second bracket 302, and the second side plate 306 are sequentially connected end to end to form a frame.

In addition, as shown in FIG. 1 and FIG. 2A, the fan modules 2 that are supported on the base plate 100 are accommodated in the fixing frame 30 and sequentially arranged between the first side plate 304 and the second side plate 306 (i.e., arranged in a line). The first side plate 304 of the fixing frame 30 is located at a first side 20 (i.e., the left side in FIG. 2A) of the adjacent fan module 2, and the second side plate 306 abuts against a second side 22 (i.e., the right side in FIG. 2A) of the adjacent fan module 2. In addition, each of the fan modules 2 is individually located between the first bracket 300 and the second bracket 302.

In the embodiment of the disclosure, the first bracket 300 and the second bracket 302 of the fixing frame 30 are riveted onto the base plate 100. The second bracket 302, the first side plate 304, and the second side plate 306 are integrally formed to be a one-pieced component. The first side plate 304 and the second side plate 306 are riveted to the first bracket 300, but the disclosure is not limited in this regard. In practice, any two adjacent ones of the first bracket 300, the second bracket 302, the first side plate 304, and the second side plate 306 can be integrally formed to be a one-pieced component and then connected to each other (by way of riveting or structurally engaging) to form the fixing frame 30, or they are individually manufactured and connected to each other to form the fixing frame 30.

As shown in FIG. 3 and FIG. 4, the first bracket 300 of the fixing frame 30 has a plurality of inlet holes 300c. The inlet holes 300c of the first bracket 300 respectively correspond to the fan modules 2. A plurality of shielding portions 300d are respectively connected in the inlet holes 300c of the first bracket 300 by stamping processes, so as to prevent a user's hand from touching the rotating blades and the shafts (not shown) in the fan modules 2. In addition, the second bracket 302 of the fixing frame 30 has a plurality of outlet holes 302c.

Each of the outlet holes 302c of the second bracket 302 respectively correspond to the fan modules 2. In other words, each of the fan modules 2 is located between the corresponding inlet hole 300c on the first bracket 300 and the corresponding outlet hole 302c on the second bracket 302.

As shown in FIG. 2A to FIG. 5, the rapidly assembling/disassembling device 3 further includes a plurality of the partitions 32. The partitions 32 are fixed in the fixing frame 30 and spaced apart from each other, and each of the partitions 32 abuts against the second side 22 of the corresponding fan module 2. Furthermore, the first bracket 300 of the fixing frame 30 has a plurality of first fixing holes 300a. The second bracket 302 of the fixing frame 30 has a plurality of second fixing holes 302a. Two sides of each of the partitions 32 respectively have a first extending arm 320 and a second extending arm 322. The first extending arm 320 of each of the partitions 32 is engaged with the corresponding first fixing hole 300a on the first bracket 300. The second extending arm 322 of each of the partitions 32 is engaged with the corresponding second fixing hole 302a on the second bracket 302. Hence, when the first bracket 300 and the second bracket 302 of the fixing frame 30 are riveted to each other, all of the partitions 32 are fixed between the first bracket 300 and the second bracket 302 and spaced apart from each other.

Furthermore, in order to prevent installing the partitions 32 between the first bracket 300 and the second bracket 302 in the wrong orientation, in the embodiment of the disclosure, the first extending arm 320 and the second extending arm 322 of each of the partitions 32 have different sizes, so as to achieve the effect of foolproof while assembling.

As shown in FIG. 2B and FIG. 5, the second side plate 306 of the fixing frame 30 further includes a first resilient arm 306a. The first resilient arm 306a abuts against the second side 22 of the corresponding fan module 2. Each of the partitions 32 includes a second resilient arm 324. The second resilient arm 324 abuts against the second side 22 of the corresponding fan module 2. In other words, when all of the fan modules 2 are positioned and fastened in the rapidly assembling/disassembling device 3, the first resilient arm 306a of the second side plate 306 and the second resilient arms 324 of the partitions 32 respectively press the second sides 22 of the fan modules 2, so as to absorb the vibrations of the fan modules 2 during operation and thus prevent the vibrations from transmitted to the housing 10.

As shown in FIG. 2 to FIG. 4 and FIG. 6, the rapidly assembling/disassembling device 3 further includes a plurality of the pushing brackets 34. The pushing brackets 34 are pivotally connected in the fixing frame 30 and spaced apart from each other, and each of the pushing brackets 34 is located at the first side 20 of the corresponding fan module 2. Furthermore, the first bracket 300 of the fixing frame 30 has a plurality of first pivoting holes 300b. The second bracket 302 of the fixing frame 30 has a plurality of second pivoting holes 302b. Two sides of each of the pushing brackets 34 respectively have a first shaft 342 and a second shaft 344, and the axis of the first shaft 342 coincides with the axis of the second shaft 344. The first shaft 342 of each of the pushing brackets 34 is pivotally connected to the corresponding first pivoting hole 300b on the first bracket 300. The second shaft 344 of each of the pushing bracket 34 is pivotally connected to the corresponding second pivoting hole 302b on the second bracket 302. Hence, when the first bracket 300 and the second bracket 302 of the fixing frame 30 are riveted to each other, all of the pushing brackets 34 are fixed between the first bracket 300 and the second bracket 302 and spaced apart from each other, and each of the pushing brackets 34 is capable of rotating with the first shaft 342 and the second shaft 344 of itself in a certain range.

As shown in FIG. 2A and FIG. 2B, each of the pushing brackets 34 of the rapidly assembling/disassembling device 3 includes two pushing arms 340. The pushing arms 340 of each of the pushing brackets 34 extend toward the second side plate 306 respectively from two sides. The second side plate 306 of the fixing frame 30 has two first breaches 306b respectively located at two upper corners at two sides of the second plate 306, so that the pushing arms 340 of the adjacent pushing bracket 34 (i.e., the rightmost fan module 2 in FIG. 2A) can respectively pass through the first breaches 306b.

As shown in FIG. 2A and FIG. 2B, each of the partitions 32 has two second breaches 326 respectively located at two sides. Hence, except the pushing bracket 34 that is closest to the second side plate 306, the pushing arms 340 of each of the rest pushing bracket 34 are capable of respectively passing through the second breaches 326 of the corresponding partition 32 (i.e., the partition 32 at right side) via the corresponding fan module 2 (i.e., the fan module 2 at right side).

In the embodiment of the disclosure, the number of first breaches 306b on the second side plate 306, the number of the second breaches 326 of each of the partitions 32, and the number of the pushing arms 340 of each of the pushing brackets 34 are all two, but the disclosure is not limited in this regard and can be adjusted as needed.

Figure 7:
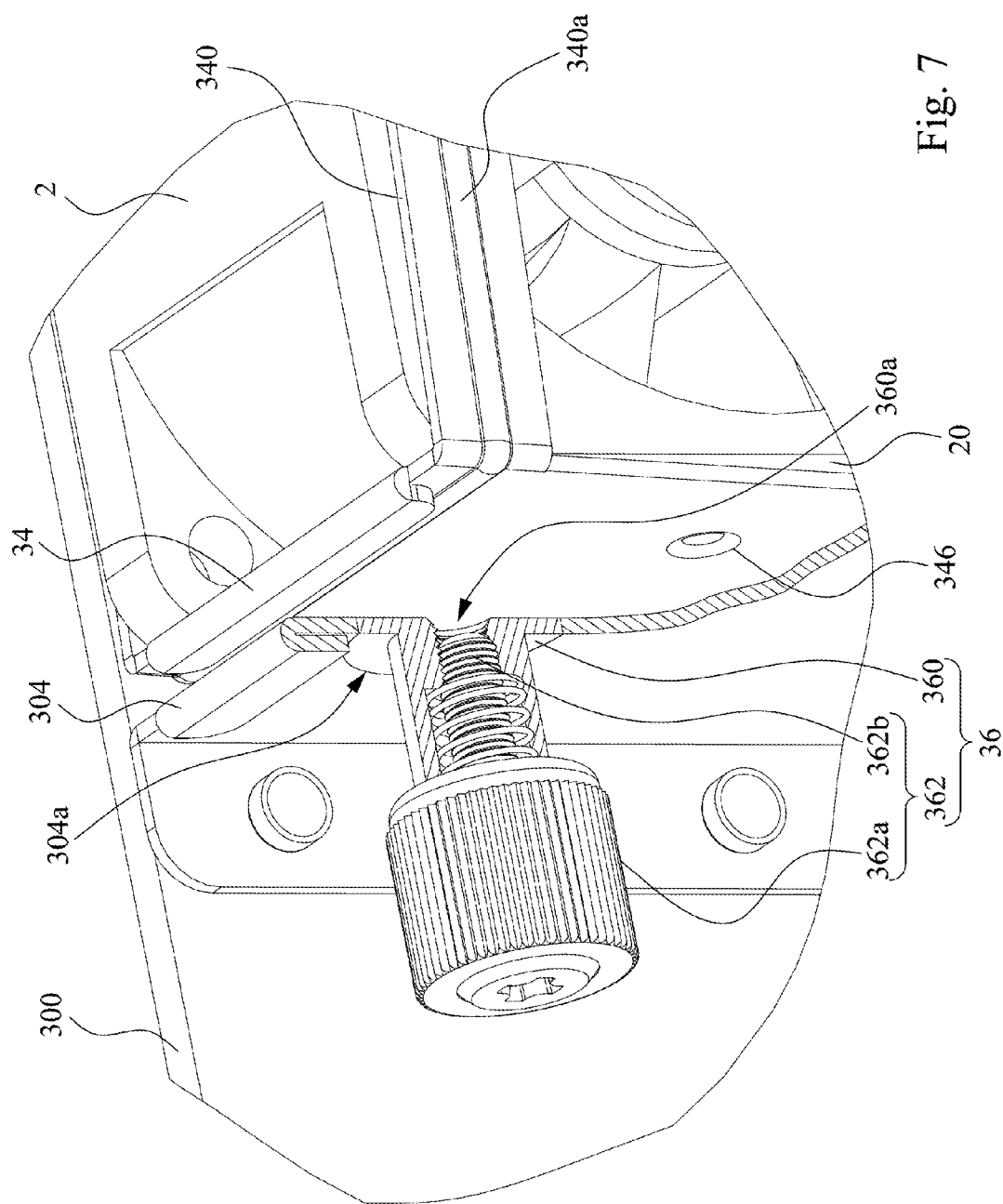
FIG. 7 is a partial sectional view of a fan module and the rapidly assembling/disassembling device in FIG. 1.

FIG. 7 is a partial sectional view of one of the fan modules 2 and the rapidly assembling/disassembling device 3 in FIG. 1.

As shown in FIG. 2A and FIG. 7, the rapidly assembling/disassembling device 3 further includes a fastening member 36. The fastening member 36 is disposed on the first side plate 304 of the fixing frame 30, and is capable of moving toward or away from the adjacent pushing bracket 34 (i.e., the leftmost pushing bracket 34 in FIG. 2A). Furthermore, the first side plate 304 of the fixing frame 30 has a through hole 304a. The fastening member 36 includes a stud 360 and a thumb screw 362. The stud 360 is disposed on the first side plate 304 and has a screw hole 360a. The screw hole 360a of the stud 360 is communicated with the through hole 304a of the first side plate 304. The thumb screw 362 includes a twisting portion 362a and a threaded portion 362b. The twisting portion 362a of the thumb screw 362 is located out of the fixing frame 30, so as to be twisted by the user's hand. The threaded portion 362b of the thumb screw 362 is connected to the twisting portion 362a, fastened to the screw hole 360a, and capable of entering the fixing frame 30 via the through hole 304a. Hence, the user can move the thumb screw 362 toward or away from the adjacent pushing bracket 34 along the axis of the screw hole 360a by twisting the thumb screw 362.

Figure 8A:
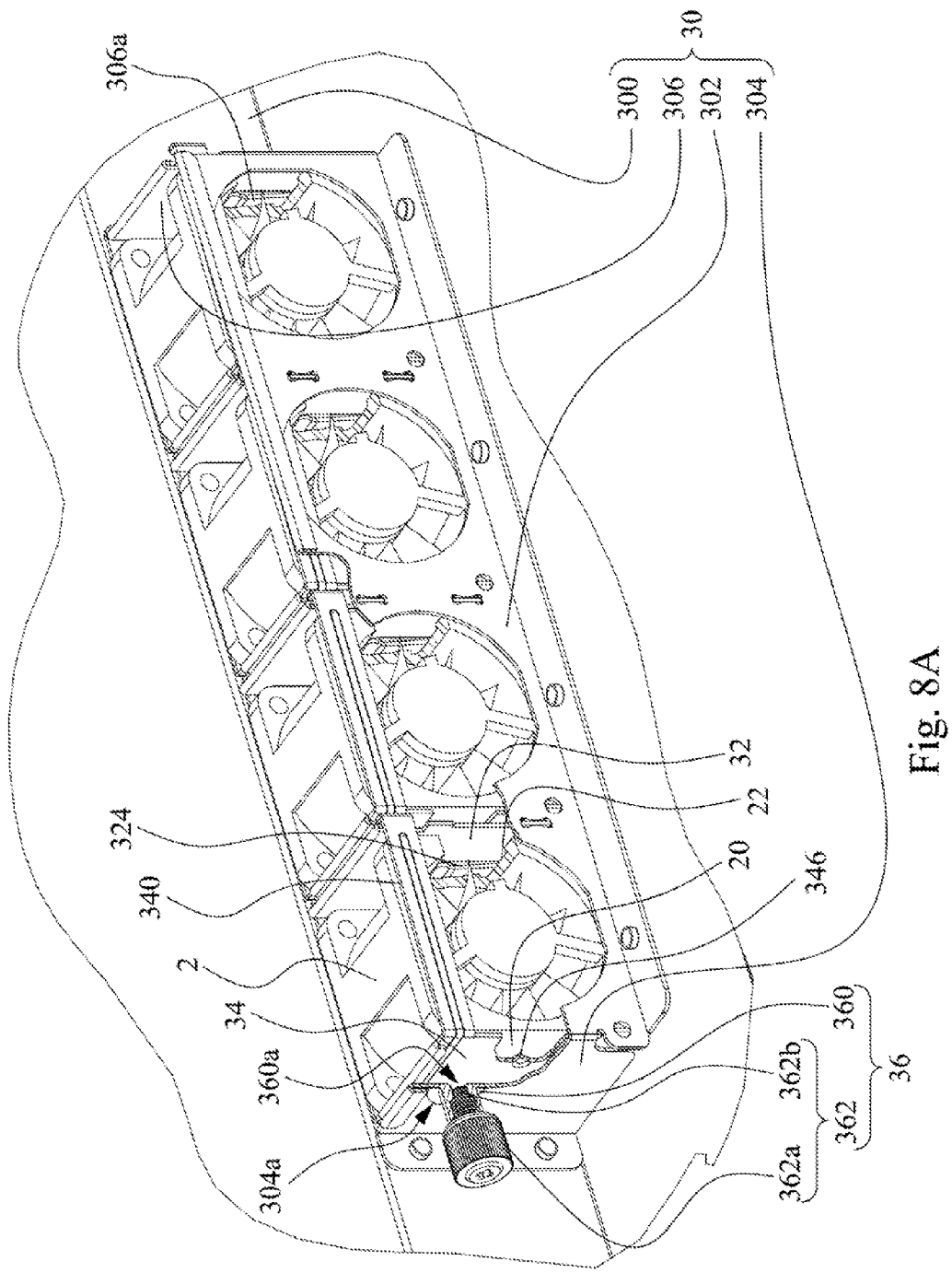
FIG. 8A is a partial sectional view of FIG. 1, in which the rapidly assembling/disassembling device does not fasten the fan modules.
Figure 8B:
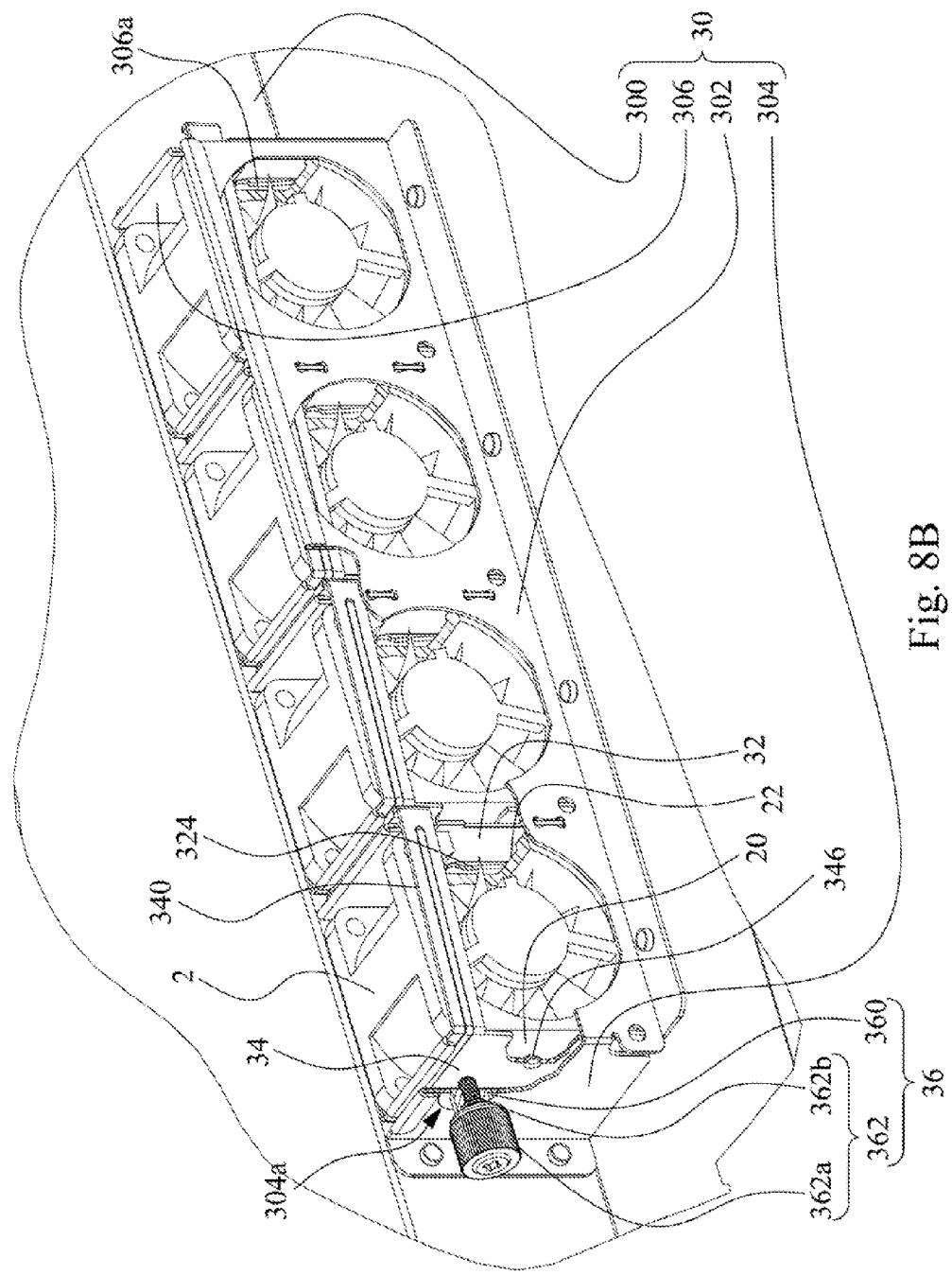
FIG. 8B is another partial sectional view of FIG. 1, in which the rapidly assembling/disassembling fastens the fan modules.

FIG. 8A is a partial sectional view of FIG. 1, in which the rapidly assembling/disassembling device 3 does not fasten the fan modules 2. FIG. 8B is another partial sectional view of FIG. 1, in which the rapidly assembling/disassembling 3 fastens the fan modules 2.

As shown in FIG. 8A and FIG. 8B, when the user twists the thumb screw 362 of the fastening member 36 to make the threaded portion 362b of the thumb screw 362 move toward the interior of the fixing frame 30 along the axis of the screw hole 360a to push the adjacent pushing bracket 34 (i.e., the leftmost pushing bracket 34 in FIG. 8A and FIG. 8B), the pushing bracket 34 will rotate with the first shaft 342 and the second shaft 344 of itself to abut against the first side 20 of the adjacent fan module 2 (i.e., the leftmost fan module 2 in FIG. 8A and FIG. 8B). The pushing arms 340 of the pushing bracket 34 pushed by the thumb screw 362 will push the next pushing bracket 34 at the right side, and the pushing arms 340 of the next pushing bracket 34 will also push the following pushing bracket 34.

In other words, except the leftmost pushing bracket 34, each of the rest pushing brackets 34 is pushed by the corresponding pushing arms 340 at the left side so as to rotate to abut against the first side 20 of the corresponding fan module 2 at the right side. Hence, when the user fastens the thumb screw 362, all of the pushing brackets 34 will rotate together and respectively abut against the first sides 20 of the fan modules 2, so as to fasten all of the fan modules 2 at the same time (as FIG. 8B shows). In contrast, when the user loosens the thumb screw 362, each of the first resilient arm 306a of the second side plate 306 and the second resilient arms 324 of the partitions 32 recovers and pushes the corresponding fan module 2 back, and each of the fan modules 2 pushes the corresponding pushing bracket 34 back, so that all of the fan modules 2 can be released at the same time (as FIG. 8A shows).

In the embodiment of the disclosure, the distal end of each of the pushing arms 340 of the pushing brackets 34 has a bending portion 348, so as to increase the contact area of pushing the corresponding pushing bracket 34. In addition, each of the pushing arms 340 of the pushing brackets 34 has a reinforcing rib 340a along the extending direction of the pushing arm 340 (can be formed by stamping processes), so as to increase the strength of the pushing arm 340 and prevent the pushing arm 340 from deformed.

Furthermore, it should be pointed out that if each of the pushing brackets 34 abut against the first side 20 of the corresponding fan module 2 by surface contacting, the problem of forcing uneven might occurred. Hence, in the embodiment of the disclosure, each of the pushing brackets 34 further includes two protruding portions 346. The protruding portions 346 of each of the pushing bracket 34 protrude toward the first side 20 of the corresponding fan module 2 at the right side. Therefore, each of the pushing brackets 34 can abut against the first side 20 of the corresponding fan module 2 with the protruding portions 346 by point contacting, so as to firmly fasten the fan modules 2.

In the embodiment of the disclosure, in order to fasten four fan modules 2, the rapidly assembling/disassembling device 3 includes three partitions 32 and four pushing brackets 34, but the disclosure is not limited in this regard. In practice, when the number of the fan modules 2 need to be fastened increases or decreases, by correspondingly increasing or decreasing the numbers of the partitions 32 and the pushing brackets 34 according to the same configuration and operation principles of the rapidly assembling/disassembling device 3, the fan modules 2 can still be fastened.

In the embodiment of the disclosure, the first bracket 300 and the second bracket 302 of the fixing frame 30, the partitions 32, and the pushing brackets 34 are all manufactured by stamping metal sheets, and all of the edges that can be touched by the user are folded and flattened, so as to enhance the strength of all components and achieve the purpose of preventing the user from slashed by the edges.

In an embodiment of the disclosure, the second side plate 306 of the fixing frame 30 can be replaced by an additional partition 32. By fixing the additional partition 32 between the first bracket 300 and the second bracket 302 with the same way of the other partitions 32, the additional partition 32 can provide the function of the omitted second side plate 306.

According to the foregoing recitations of the embodiments of the disclosure, it can be seen that the rapidly assembling/disassembling device fixes the fixing frame onto the base plate of the electronic equipment to accommodate the fan modules. The pushing brackets that are pivotally connected in the fixing frame are further respectively located at the first sides of the fan modules, and the second side plate of the fixing frame and the partitions that are fixed in the fixing frame respectively abut against the second sides of the fan modules. During the period that a user tightens the thumb screw disposed at the first side plate of the fixing frame, the thumb screw pushes the adjacent pushing bracket to rotate, and the rotated pushing bracket sequentially pushes the next pushing bracket. Based on the same principle, all of the pushing brackets will rotate together and respectively abut against the first sides of the fan modules, so as to fasten all of the fan modules at the same time. In contrast, when the user loosens the thumb screw, all of the fan modules can be released at the same time.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A rapidly assembling/disassembling device for assembling or disassembling a plurality of fan modules, the rapidly assembling/disassembling device comprising:
    a fixing frame comprising a first side plate and a second side plate, wherein the fan modules are accommodated in the fixing frame and sequentially arranged between the first side plate and the second side plate, the first side plate is located at a first side of a first one of the fan modules, and the second side plate abuts against a second side of a last one of the fan modules;
    a plurality of partitions fixed in the fixing frame, wherein each of the partitions abuts against the second side of a corresponding one of fan modules;
    a plurality of pushing brackets pivotally connected in the fixing frame, wherein each of the pushing brackets is located at the first side of the corresponding one of fan modules and comprises a pushing arm, and the pushing arm extends toward the second side plate; and
    a fastening member disposed on the first side plate and capable of moving toward or away from a first one of the pushing brackets, wherein when the fastening member pushes the first one of the pushing bracket to rotate to abut against the first side of the first one of the fan modules, each of the other pushing brackets is pushed by a corresponding one of the pushing arm so as to abut against the first side of the corresponding one of fan modules.

2. The rapidly assembling/disassembling device of claim 1, wherein the second side plate has a first breach, the first breach is configured for the pushing arm of a last one of the pushing brackets to pass through, each of the partitions has a second breach, and the second breach is configured for the pushing arm of the corresponding one of the pushing brackets to pass through.

3. The rapidly assembling/disassembling device of claim 2, wherein the second side plate comprises a first resilient arm, and the first resilient arm abuts against the second side of the last one of the fan modules.

4. The rapidly assembling/disassembling device of claim 3, wherein each of the partitions comprises a second resilient arm, and the second resilient arm abuts against the second side of the corresponding one of fan modules.

5. The rapidly assembling/disassembling device of claim 4, wherein each of the pushing brackets further comprises a protruding portion, and the protruding portion protrudes toward the first side of the corresponding one of fan modules.

6. The rapidly assembling/disassembling device of claim 5, wherein the first side plate has a through hole, and the fastening member comprises:
   a stud disposed on the first side plate and having a screw hole, the screw hole communicated with the through hole; and
   a thumb screw fastened to the screw hole and capable of moving toward or away from the first one of the pushing brackets.

7. The rapidly assembling/disassembling device of claim 6, wherein the thumb screw comprises:
   a twisting portion located out of the fixing frame; and
   a threaded portion connected to the twisting portion, fastened to the screw hole, and capable of entering the fixing frame via the through hole.

8. The rapidly assembling/disassembling device of claim 7, wherein the fixing frame further comprises a first bracket and a second bracket, the first bracket and the second bracket are respectively connected to two sides of the first side plate and two sides of the second side plate, and each of the fan modules is individually located between the first bracket and the second bracket.

9. The rapidly assembling/disassembling device of claim 8, wherein the first bracket has a plurality of first fixing holes, the second bracket has a plurality of second fixing holes, two sides of each of the partitions respectively have a first extending arm and a second extending arm, the first extending arm is engaged with a corresponding one of the first fixing holes, and the second extending arm is engaged with a corresponding one of the second fixing holes.

10. The rapidly assembling/disassembling device of claim 9, wherein the first bracket has a plurality of first pivoting holes, the second bracket has a plurality of second pivoting holes, two sides of each of the pushing brackets respectively have a first shaft and a second shaft, an axis of the first shaft coincides with an axis of the second shaft, the first shaft is pivotally connected to a corresponding one of the first pivoting holes, and the second shaft is pivotally connected to a corresponding one of the second pivoting holes.

11. An electronic equipment, comprising:
   a housing comprising a base plate;
   a plurality of fan modules; and
   a rapidly assembling/disassembling device comprising:
      a fixing frame disposed on the base plate and comprising a first side plate and a second side plate, wherein the fan modules are supported on the base plate, accommodated in the fixing frame, and sequentially arranged between the first side plate and the second side plate, the first side plate is located at a first side of a first one of the fan modules, and the second side plate abuts against a second side of a last one of the fan modules;
      a plurality of partitions fixed in the fixing frame, wherein each of the partitions abuts against the second side of a corresponding one of fan modules;
      a plurality of pushing brackets pivotally connected in the fixing frame, wherein each of the pushing brackets is located at the first side of the corresponding one of fan modules and comprises a pushing arm, and the pushing arm extends toward the second side plate; and
      a fastening member disposed on the first side plate and capable of moving toward or away from a first one of the pushing brackets, wherein when the fastening member pushes the first one of the pushing bracket to rotate to abut against the first side of the first one of the fan modules, each of the other pushing brackets is pushed by a corresponding one of the pushing arm so as to abut against the first side of the corresponding one of fan modules.

12. The electronic equipment of claim 11, wherein the second side plate has a first breach, the first breach is configured for the pushing arm of a last one of the pushing brackets to pass through, each of the partitions has a second breach, and the second breach is configured for the pushing arm of the corresponding one of the pushing brackets to pass through.

13. The electronic equipment of claim 12, wherein the second side plate comprises a first resilient arm, and the first resilient arm abuts against the second side of the last one of the fan modules.

14. The electronic equipment of claim 13, wherein each of the partitions comprises a second resilient arm, and the second resilient arm abuts against the second side of the corresponding one of fan modules.

15. The electronic equipment of claim 14, wherein each of the pushing brackets further comprises a protruding portion, and the protruding portion protrudes toward the first side of the corresponding one of fan modules.

16. The electronic equipment of claim 15, wherein the first side plate has a through hole, and the fastening member comprises:
   a stud disposed on the first side plate and having a screw hole, the screw hole communicated with the through hole; and
   a thumb screw fastened to the screw hole and capable of moving toward or away from the first one of the pushing brackets.

17. The electronic equipment of claim 16, wherein the thumb screw comprises:
   a twisting portion located out of the fixing frame; and
   a threaded portion connected to the twisting portion, fastened to the screw hole, and capable of entering the fixing frame via the through hole.

18. The electronic equipment of claim 17, wherein the fixing frame further comprises a first bracket and a second bracket, the first bracket and the second bracket are respectively connected to two sides of the first side plate and two sides of the second side plate, and each of the fan modules is individually located between the first bracket and the second bracket.

19. The electronic equipment of claim 18, wherein the first bracket has a plurality of first fixing holes, the second bracket has a plurality of second fixing holes, two sides of each of the partitions respectively have a first extending arm and a second extending arm, the first extending arm is engaged with a corresponding one of the first fixing holes, and the second extending arm is engaged with a corresponding one of the second fixing holes.

20. The electronic equipment of claim 19, wherein the first bracket has a plurality of first pivoting holes, the second bracket has a plurality of second pivoting holes, two sides of each of the pushing brackets respectively have a first shaft and a second shaft, an axis of the first shaft coincides with an axis of the second shaft, the first shaft is pivotally connected to a corresponding one of the first pivoting holes, and the second shaft is pivotally connected to a corresponding one of the second pivoting holes.

\* \* \* \* \*